US012588306B2

(12) United States Patent
Abadie et al.

(10) Patent No.: US 12,588,306 B2
(45) Date of Patent: Mar. 24, 2026

(54) IMAGE SENSORS COMPRISING AN ARRAY OF INTERFERENCE FILTERS

(71) Applicant: Commissariat à l'Énergie Atomique et aux Énergies Alternatives, Paris (FR)

(72) Inventors: Quentin Abadie, Grenoble (FR); François Deneuville, Grenoble (FR); Lilian Masarotto, Grenoble (FR); Jérôme Vaillant, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 715 days.

(21) Appl. No.: 17/370,140

(22) Filed: Jul. 8, 2021

(65) Prior Publication Data

US 2022/0013561 A1 Jan. 13, 2022

(30) Foreign Application Priority Data

Jul. 10, 2020 (FR) ...................................... 2007354

(51) Int. Cl.
*H10F 39/00* (2025.01)
(52) U.S. Cl.
CPC ....... *H10F 39/8053* (2025.01); *H10F 39/024* (2025.01); *H10F 39/8057* (2025.01); *H10F 39/8063* (2025.01)
(58) Field of Classification Search
CPC .......................... H01L 27/14621–14623; H01L 27/14645–14649; H01L 27/146–147;
(Continued)

(56) References Cited

U.S. PATENT DOCUMENTS

2013/0032915 A1* 2/2013 Tonotani ........... H01L 27/14627
257/E31.127
2013/0214160 A1* 8/2013 Cazaux .................. H01L 31/18
438/98
(Continued)

FOREIGN PATENT DOCUMENTS

EP 3 098 851 A2 11/2016
EP 3 376 267 A1 9/2018
(Continued)

OTHER PUBLICATIONS

Translation of foreign patent FR2999338A1 and original document merged. (Year: 2014).*

(Continued)

*Primary Examiner* — Britt Hanley
*Assistant Examiner* — Casey Paul Boatman
(74) *Attorney, Agent, or Firm* — Wolf, Greenfield & Sacks, P.C.

(57) ABSTRACT

An image sensor including a substrate including first portions containing photodetectors adapted to capturing a radiation and second portions containing electronic components located between come of the first portions; a pixelated filter including filter pixels, at least some of which include an interference filter including a stack of planar layers; and shields reflecting or absorbing said radiation covering the second portions and including walls reflecting or absorbing said radiation extending between filter pixels along at least a portion of the height of the pixelated filter.

14 Claims, 5 Drawing Sheets

(58) Field of Classification Search
   CPC ..... G02B 5/28; H10F 39/8053; H10F 39/024;
                          H10F 39/8063; H10F 39/182
   See application file for complete search history.

(56)                     References Cited

U.S. PATENT DOCUMENTS

| | | | |
|---|---|---|---|
| 2016/0163760 A1* | 6/2016 | Tsai | H01L 27/14685 |
| | | | 438/70 |
| 2019/0377109 A1* | 12/2019 | Frey | G02B 5/283 |
| 2019/0393075 A1* | 12/2019 | Gasse | H01L 21/76898 |
| 2020/0013821 A1* | 1/2020 | Oota | G02B 5/201 |

FOREIGN PATENT DOCUMENTS

| | | | | |
|---|---|---|---|---|
| EP | 3 579 028 A1 | 12/2019 | | |
| FR | 2999338 A1 * | 6/2014 | | G01J 5/0806 |

OTHER PUBLICATIONS

FR2999338a1, Jenouvrier (numbered paragraphs) (Year: 2014).*
Preliminary Search Report for French Application No. 2007354, dated Mar. 12, 2021.
Vereecke et al., Fabrication of a CMOS-based imaging chip with monolithically integrated RGB and NIR filters. Proceedings of the MDPI Eurosensors 2018 Conference. Sep. 9-12, 2018;2(13):751.
FR2007354, Mar. 12, 2021, Preliminary Search Report.

* cited by examiner

IMAGE SENSORS COMPRISING AN ARRAY OF INTERFERENCE FILTERS

CROSS-REFERENCE TO RELATED APPLICATION

This application claims priority to French Patent Application 2007354, filed Jul. 10, 2020, the contents of which is incorporated herein by reference in its entirety.

TECHNICAL BACKGROUND

The present disclosure concerns an image sensor comprising an array of interference filters, and a method of manufacturing such an image sensor.

PRIOR ART

It is known to form arrays of interference filters, particularly for image sensors, also called imagers, in the visible, infrared (particularly for wavelengths from 650 nm to 1,050 nm), and/or ultraviolet range, which require separating a plurality of frequency ranges. Such an array of filters is also called pixelated filter, a filter pixel, or elementary filter, corresponding to the smallest element of the filter having same filtering properties.

An example of application of a pixelated filter corresponds to a device comprising a sensor capable of acquiring color images and infrared images. The pixelated filter may then comprise first filter pixels giving way to visible light and blocking infrared radiation and second filter pixels giving way to infrared radiation, particularly near infrared, and blocking visible light.

An example of application of a sensor adapted to acquiring color images and infrared images is a so-called RGB-Z filter where the infrared image is used for depth measurements. The infrared image may be obtained by the projection into the scene to be imaged of an infrared radiation in a reduced spectral band, for example, at 850 nm, 905 nm, 940 nm, etc., with a reduced spectral band.

In an image sensor, the pixelated filter generally covers a substrate having an array of photodetectors formed therein. An interference filter is formed by a stacking of a plurality of layers. As an example, an interference filter may comprise a stack of semi-reflective metal layers separated by dielectric layers and/or an alternation of dielectric layers having different refraction indexes, also called optical indexes hereafter. The thicknesses of the filter layers depend on the desired filtering properties.

The image sensor may further comprise in the substrate electronic components in addition to the photodetectors, particularly memory elements and transistors, located between photodetectors. The substrate comprises a front side and a back side, the photodetectors and the other electronic components being formed on the front side of the substrate. The image sensor is said to be back-side illuminated (BSI) when the illumination of the substrate is performed on the back side of the substrate, the pixelated filter covering the back side of the substrate.

It is necessary to protect electronic components other than the photodetectors against the incident radiation to ensure their proper operation. However, the forming of shields on the back side of the substrate to protect electronic components other than photodetectors against the incident radiation may interfere with the manufacturing of the pixelated filter.

SUMMARY

Thus, an object of an embodiment is to at least partly overcome the disadvantages of the previously-described image sensors and manufacturing methods.

Another object of an embodiment is for the image sensor to comprise electronic components other than photodetectors protected during the illumination of the image sensor.

Another object of an embodiment is for the image sensor to be back-side illuminated.

An embodiment provides an image sensor comprising:
a substrate comprising first portions containing photodetectors adapted to capturing a radiation and second portions containing electronic components located between some of the first portions;
a pixelated filter comprising filter pixels having at least certain components comprising an interference filter comprising a stack of planar layers; and
shields reflecting or absorbing said radiation covering the second portions and comprising walls reflecting or absorbing said radiation extending between filter pixels over at least a portion of the height of the pixelated filter.

According to an embodiment, the pixelated filter comprises first and second opposite surfaces, the walls extending from the first surface to the second surface and delimiting the filter pixels.

According to an embodiment, the image sensor comprises an array of lenses resting on the second surface, the pixelated filter being interposed between the substrate and the array of lenses, the first surface being on the substrate side and the second surface being on the lens side, the focal plane of the lenses corresponding to the second surface to within 500 nm.

According to an embodiment, the walls are at least partly metallic.

According to an embodiment, the filter pixels are distributed into first filter pixels and second filter pixels, each first filter pixel comprising a first interference filter.

According to an embodiment, the sensor comprises colored filters interposed between the first filter pixels and the lenses, the colored filters comprising at least first colored filters adapted to giving way to visible light only in a first wavelength range and second colored filters adapted to giving way to visible light only in a second wavelength range different from the first range.

According to an embodiment, each first filter pixel comprises a first dielectric block covering the first interference filter.

According to an embodiment, each second filter pixel comprises a second dielectric block, having a thickness greater than or equal to the thickness of the first interference filter.

According to an embodiment, each second filter pixel comprises a second interference filter covering the second dielectric block. For at least one of the second filter pixels, the second dielectric block of the second filter pixel is interposed between the first interference filters of two first filter pixels and the second interference filter of the second filter pixel is interposed between the first dielectric blocks of the first two filter pixels.

According to an embodiment, each first interference filter comprises an alternation of first dielectric layers of a first dielectric material having a first refraction index in the visible range and of second dielectric layers of a second dielectric material having a second refraction index in the visible range smaller than the first refraction index.

According to an embodiment, each second interference filter comprises an alternation of third dielectric layers of a third dielectric material having a third refraction index in the infrared range and of fourth dielectric layers of a fourth dielectric material having a fourth refraction index in the infrared range smaller than the third refraction index.

According to an embodiment, the planar layers of the interference filters come into contact with the walls.

An embodiment also provides a method of manufacturing an image sensor such as defined hereabove, comprising the steps of:

a) deposition, on the substrate, of a stack of dielectric layers having the structure of interference filters; and b) forming of the walls in the stack.

According to an embodiment, the filter pixels are distributed into first filter pixels and second filter pixels, the method comprising the steps of:

c) etching of the stack to remove the stack from the locations of the second filter pixels and keep the interference filters at the locations of the first filter pixels;

d) deposition of an insulating layer, having a thickness greater than the thickness of the stack, on the interference filters and between the interference filters; and e) etching of at least a portion of the insulating layer on the interference filters.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties. For the sake of clarity, only the steps and elements that are useful for an understanding of the embodiments described herein have been illustrated and described in detail. In particular, the means for processing the signals supplied by the sensors described hereafter are within the abilities of those skilled in the art and are not described.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to an optoelectronic device in a normal position of use. Unless specified otherwise, the expressions "around", "approximately", "substantially" and "in the order of" signify within 10%, and preferably within 5%. Further, a "substantially planar" surface is a surface having no raised or recessed areas having a thickness greater than 500 nm with respect to the mean plane of the surface. Further, in the following description, the term "lateral size" or "dimension" of a sensor element designates the maximum dimension of this element in a plane perpendicular to the stacking direction of the layers forming the sensor. Further, it is here considered that the terms "insulating" and "conductive" respectively mean "electrically insulating" and "electrically conductive".

In the following description, the refraction index of the material means the refraction index of the material over the operating wavelength range of the interference filter in the case where the refraction index of the material is substantially constant over the operating wavelength range of the interference filter, or means the average refraction index of the material over the operating wavelength range of the interference filter in the case where the refraction index of the material varies over the operating wavelength range of the interference filter Further, in the following description, "colored filter" designates a homogeneous layer made of a single material, for example, an organic resin, having properties of spectral filtering by selective bulk absorption of light in the material. Further, the term "visible light" or "visible range" designates a radiation having wavelengths in the range from approximately 400 nm to approximately 700 nm.

Figure 1:
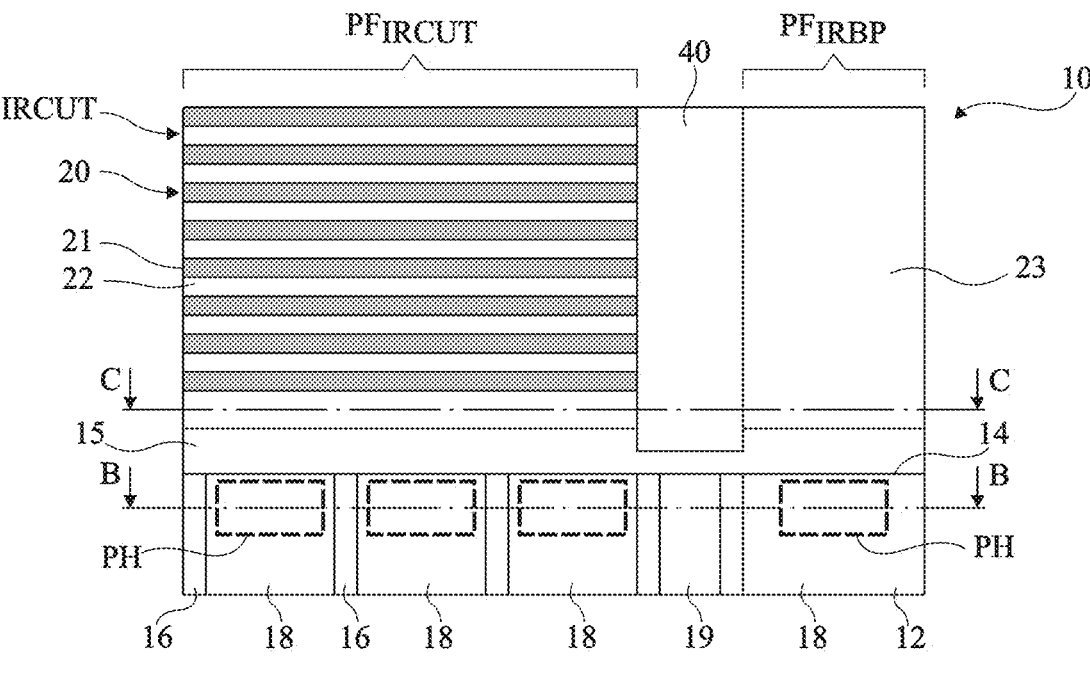
FIG. 1 is a partial simplified cross-section view of an embodiment of an image sensor comprising a pixelated interference filter.
Figure 2:
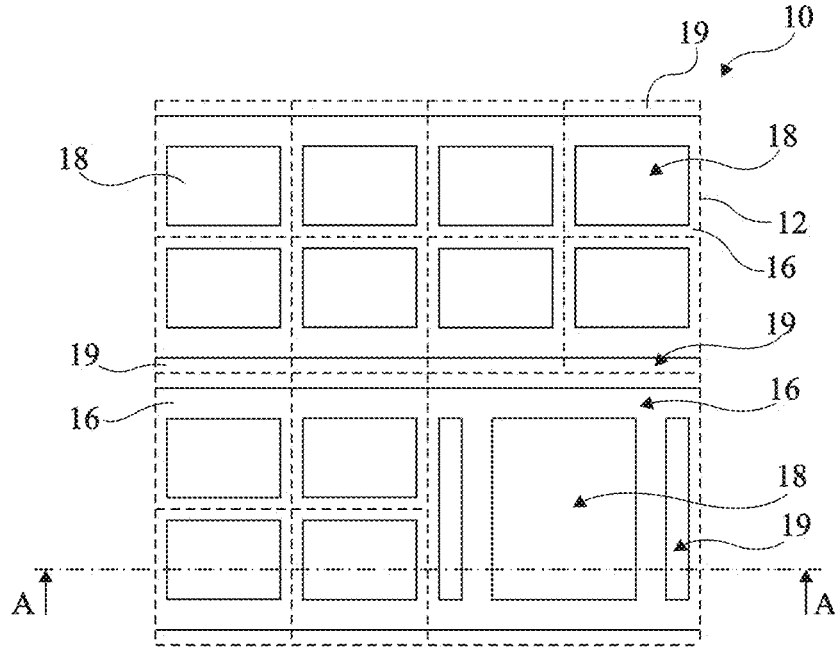
FIG. 2 is a partial simplified top cross-section view of the image sensor of FIG. 1, along a first cross-section plane.
Figure 3:
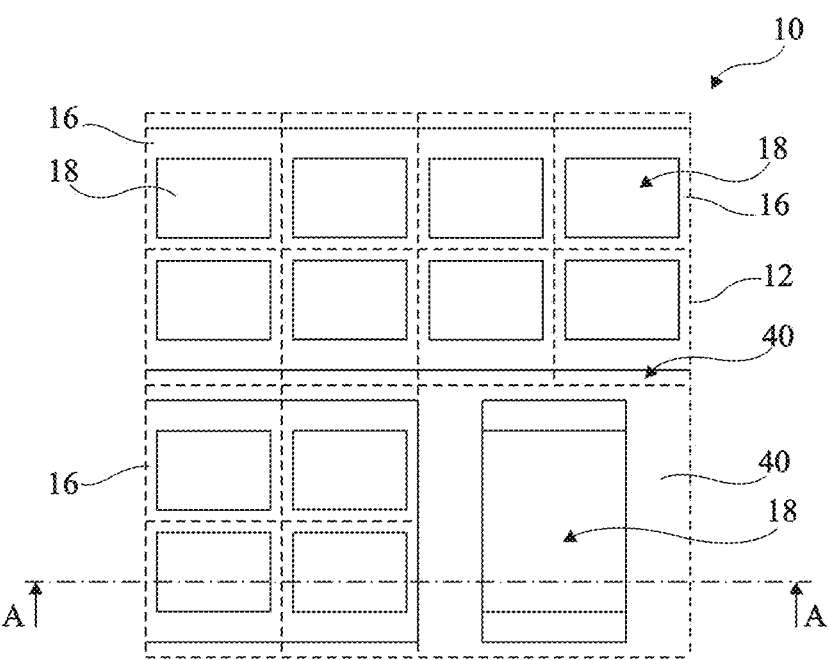
FIG. 3 is a partial simplified top cross-section view of the image sensor of FIG. 1, along a second cross-section plane.

FIGS. 1, 2, and 3 show an embodiment of an optoelectronic device 10 corresponding to an image sensor. FIG. 1 is a cross-section view of FIGS. 2 and 3 along line A-A, FIG. 2 is a cross-section of FIG. 1 along line B-B, and FIG. 3 is a cross-section of FIG. 1 along line C-C. The image sensor may be a color and infrared sensor.

Optoelectronic device 10 comprises a substrate 12, for example, made of silicon, having a back side 14, a pixelated filter 20 resting on surface 14 of substrate 12, which pixelated filter 20 is not shown in FIG. 3. Optoelectronic device 10 may comprise a dielectric layer 15, two dielectric layers or more than two dielectric layers covering surface 14, interposed between substrate 12 and pixelated filter 20. Optoelectronic device 10 may comprise electric insulation trenches 16 extending in substrate 12 and delimiting first and second portions 18, 19 of substrate 12.

In each of the first portions 18, called photosites hereafter, optoelectronic device 10 may comprise at least one photon sensor or photodetector PH formed in photosite 18, photodetectors PH being very schematically shown in FIG. 1 by squares in dotted lines. In second portions 19, optoelectronic device 10 may comprise electronic components, not shown, at least partly formed in the second portion. The electronic components may comprise memory elements and/or transistors, particularly insulated gate field-effect transistors or MOS transistors.

In the present embodiment, pixelated filter 20 comprises first and second filter pixels $PF_{IRCUT}$ and $PF_{IRBP}$. In the present embodiment, each first filter pixel $PF_{IRCUT}$ comprises an interference filter IRCUT comprising an alternation of layers 21 of a first dielectric material having a high refraction index $n_{H1}$ and of layers 22 of a second dielectric material having a low refraction index $n_{B1}$, smaller than high refraction index $n_{H1}$, where layers 21 may have different thicknesses and layers 22 may have different thicknesses. Preferably, all interference filters IRCUT have the same structure. Refraction index $n_{H1}$ may be in the range from 1.8 to 2.5. Refraction index $n_{B1}$ may be in the range from 1.3 to 2.5. In the present embodiment, each second filter pixel $PF_{IRBP}$ corresponds to a dielectric block 23.

Optoelectronic device 10 further comprises walls 40 absorbing or reflective in visible light and infrared, extending in pixelated filter 20 and covering the second portions 19. In the present embodiment, walls 40 extend across the entire thickness of pixelated filter 20, measured along the stacking direction of device 10. Preferably, walls 40 are reflective in visible light and infrared. Walls 40 may be metallic or comprise a metal coating having a thickness typically greater than 50 nm. The metal may be tungsten, copper, aluminum, silver, or a mixture or alloys of these metals. It is possible for walls 40 not to be in contact with substrate 12, at least a portion of dielectric layer 15 being interposed between walls 40 and substrate 12, as shown in FIG. 1. Preferably, the layers 21 and 22 of interference filters IRCUT are substantially planar and come into contact with walls 40.

Walls 40 form a shield protecting the electronic components present in the portions 19 of substrate 12 against the radiation which would reach surface 14 in the absence of walls 40.

Optoelectronic device 10 may comprise one or a plurality of dielectric layers, not shown, particularly including a passivation layer and/or an antireflection layer, covering surface 14, interposed between substrate 12 and pixelated filter 20.

Figure 4:
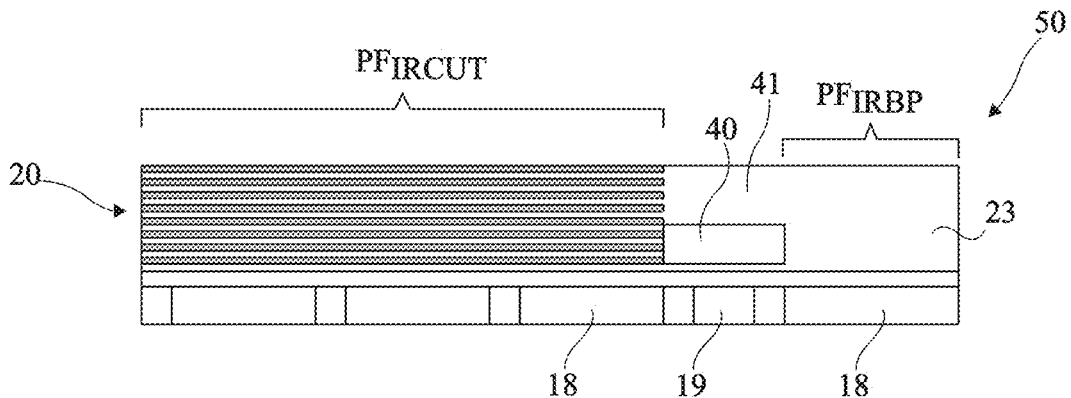
FIG. 4 is a partial simplified cross-section view of another embodiment of an image sensor comprising a pixelated interference filter.

FIG. 4 is a partial simplified cross-section view similar to FIG. 1 of another embodiment of an optoelectronic device 50 corresponding to an image sensor. Optoelectronic device 50 comprises all the elements of optoelectronic device 10, with the difference that each wall 40 only extends over a portion of the thickness of pixelated filter 20, measured along the stacking direction. Each wall 40 is then covered with a dielectric block 41 over the rest of the thickness of pixelated filter 20.

Figure 5:
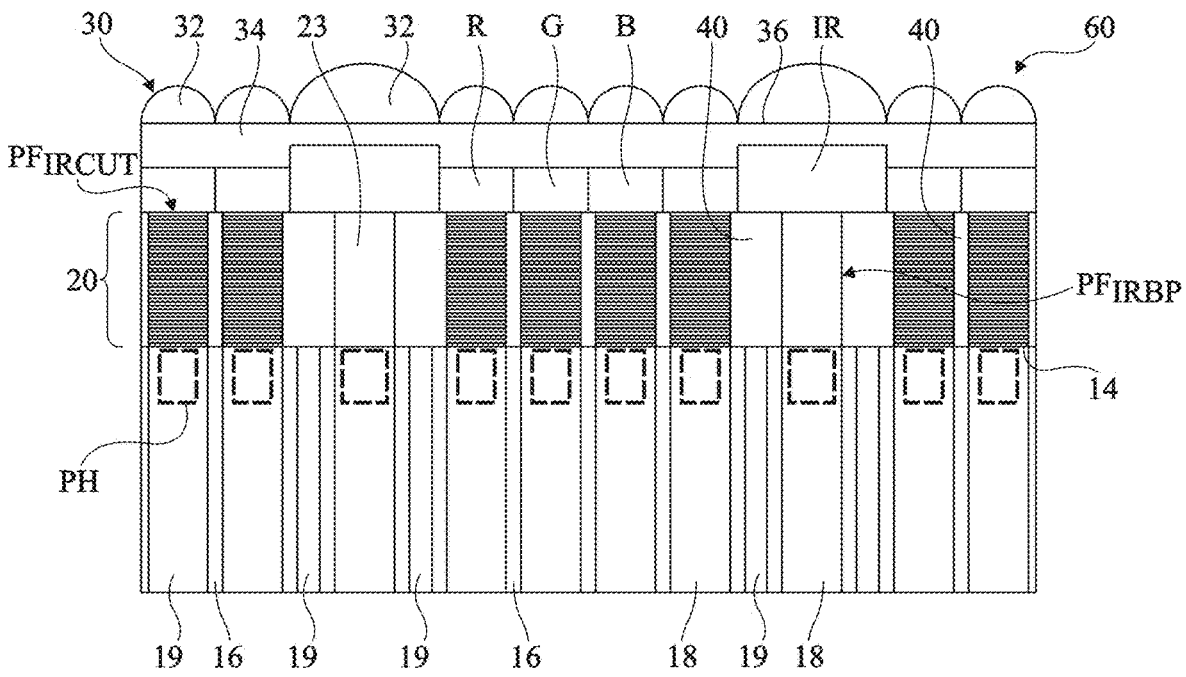
FIG. 5 is a partial simplified cross-section view of another embodiment of an image sensor comprising a pixelated interference filter and an array of microlenses.
Figure 6:
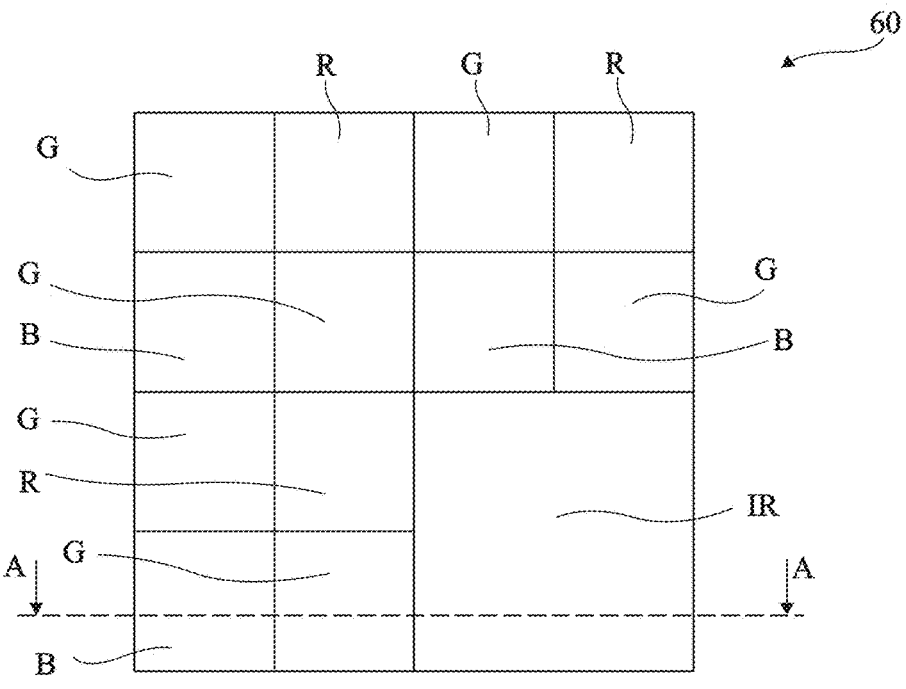
FIG. 6 is a partial simplified top view of the image sensor of FIG. 5.

FIGS. 5 and 6 show an embodiment of an optoelectronic device 60 corresponding to an image sensor, FIG. 5 being a cross-section view of FIG. 2 along line A-A. The image sensor may be a color and infrared sensor.

Optoelectronic device 60 comprises all the elements of optoelectronic device 10 and further comprises an array 30 of microlenses 32, only shown in FIG. 5, resting on pixelated filter 20.

In the present embodiment, walls 40 delimit the filter pixels $PF_{IRCUT}$ and $PF_{IRBP}$ for each photosite 18. This means that walls 40 cover portions 19 but are further present to separate filter pixels $PF_{IRCUT}$ and $PF_{IRBP}$ between photosites 18 without covering the portions 19 of substrate 12.

Optoelectronic device 60 may further comprise colored filters, particularly red filters R, green filters G, blue filters B, and infrared filters IR, resting on pixelated filter 20 and interposed between pixelated filter 20 and microlenses 32. The R, G, B colored filters and the IR infrared filters are called monoblock filters hereafter. According to an embodiment, the R, G, and B colored filters cover the first filter pixels $PF_{IRCUT}$ and the IR infrared filters cover the second filter pixels $PF_{IRBP}$. As a variant, the R, G, and B colored filters may not be present, only the IR infrared filters being present. Optoelectronic device 60 may further comprise a planarization layer 34, interposed between the R, G, B, IR monoblock filters and array 30 of microlenses 32, comprising a substantially planar surface 36 having array 30 of microlenses 32 resting thereon.

According to an embodiment, the focal length of each microlens 32 is in the range from 200 nm to 1,500 nm for the microlens. According to an embodiment, the image focal plane of each microlens 32 is located, to within 500 nm, on the surface of pixelated filter 20 in contact with the R, G, B, IR monolithic filters. Advantageously, the image focal plane of microlenses 32 is closer to microlenses 32 than if it was located on the surface 14 of substrate 12. The manufacturing of microlenses 32 is thus eased, even when the lateral dimensions of microlenses 32 are smaller than 5 μm, preferably smaller than 2 μm.

When walls 40 are reflective, the radiation reaching each filter pixel is guided through the filter pixel $PF_{IRCUT}$ or $PF_{IRBP}$ all the way to the photosite 18 covered with the filter pixel by reflecting on walls 40. The optical crosstalk between adjacent photosites it thus prevented. Further, incident radiation losses are decreased. When walls 40 are absorbing, incident radiation losses may occur. However, the optical crosstalk between adjacent photosites is prevented.

According to an embodiment, the first filter pixels $PF_{IRCUT}$ transmit visible light and substantially do not transmit the infrared radiation for wavelengths greater than a threshold in the range from 630 nm to 750 nm. According to the present embodiment, the second filter pixels $PF_{IRBP}$ transmit visible light and infrared radiation.

Photodetectors PH may be capable of detecting radiations in different wavelength ranges or may be capable of detecting radiations in the same wavelength range. In this last case, only the presence of filter pixels $PF_{IRCUT}$ and $PF_{IRBP}$ and of the R, G, B, IR monolithic filters enables to detect radiations in different wavelength ranges. Each filter pixel $PF_{IRCUT}$ and $PF_{IRBP}$ may then cover at least one photodetector PH of the sensor and play, with the associated R, G, B, IR monolithic filter, the role of a bandpass filter for the incident radiation which reaches the sensor to supply a radiation adapted to the wavelength range detected by the associated photodetector. The lateral dimensions of each filter pixel $PF_{IRCUT}$ or $PF_{IRBP}$ may be substantially equal to the lateral dimensions of the photosite 18 covered by this filter pixel. The layout of the filter pixels and of the monolithic filters may follow that of the photosites.

According to an embodiment, each first filter pixel $PF_{IRCUT}$ is covered with a colored filter among the R, G, B filters giving way to visible light in different wavelength ranges. According to an embodiment, each second filter pixel $PF_{IRBP}$ is covered with an infrared filter IR giving way to infrared radiation. According to an embodiment, optoelectronic device 60 comprises first colored filters R covering first filter pixels $PF_{IRCUT}$ and, for visible light, only giving way to red wavelengths, particularly, wavelengths in the range from 580 nm to 700 nm. According to an embodiment, optoelectronic device 60 comprises second G colored filters covering first filter pixels $PF_{IRCUT}$ and, for visible light, only giving way to green wavelengths, particularly, wavelengths in the range from 470 nm to 590 nm. According to an embodiment, optoelectronic device 60 comprises third B colored filters covering the first filter pixels $PF_{IRCUT}$ and, for visible light, only giving way to blue wavelengths, particularly, wavelengths in the range from 380 nm to 500 nm. According to an embodiment, optoelectronic device 60 comprises IR infrared filters covering second filter pixels $PF_{IRBP}$ and blocking visible light, and particularly giving way to a radiation of wavelengths in the range from 750 nm to 3,000 nm.

The thickness of pixelated filter 20 may be in the range from 0.5 µm to 4 µm, preferably from 1 µm to 3 µm. Each dielectric block 23 may have substantially the same thickness, measured along the stacking direction, as the thickness of interference filter IRCUT. According to another embodiment, each first filter pixel $PF_{IRCUT}$ further comprises a dielectric layer, not shown, covered with interference filter IRCUT. In this case, each dielectric block 23 can then have substantially the same thickness, measured along the stacking direction, as the sum of the thickness of interference filter IRCUT and of the thickness of the dielectric layer.

The first dielectric material may be selected from the group comprising silicon nitride (SiN), hafnium oxide ($HfO_x$), aluminum oxide ($AlO_x$), an alloy of aluminum, oxygen, and nitrogen ($AlO_xN_y$), an alloy of silicon, oxygen, carbon, and nitrogen ($SiO_xC_yN_z$), silicon nitride ($SiN_x$), niobium oxide ($NbO_x$), tantalum oxide ($TaO_x$), titanium oxide ($TiO_x$), and mixtures of at least two of these compounds.

The second dielectric material may be selected from the group comprising silicon dioxide ($SiO_2$), magnesium fluoride ($MgF_2$), silicon oxide ($SiO_x$), silicon oxynitride ($SiO_xN_y$), hafnium oxide ($HfO_x$), aluminum oxide ($AlO_x$), a film made up of aluminum, oxygen, and nitrogen ($AlO_xN_y$), a film made up of silicon, oxygen, carbon, and nitrogen ($SiO_xC_yN_z$), silicon nitride ($SiN_x$), and mixtures of at least two of these compounds. The dielectric blocks 23 forming the second filter pixels $PF_{IRBP}$ may be made of the second dielectric material.

According to an embodiment, each R, G, B filter corresponds to a colored resin block and each IR filter corresponds to a black resin block.

According to an embodiment, photosites 18 may have different lateral dimensions. As shown in FIG. 2, each photosite 18 covered with an infrared filter IR has, in top view, a surface area substantially equal to four times the surface area of a photosite 18 covered with one of the R, G, or B colored filters. According to an embodiment, each photosite 18 covered with one of the R, G, or B colored filters has in top view a surface area inscribed within a square having a side length smaller than 5 µm, preferably smaller than 2 µm.

According to an embodiment, microlenses 32 have different shapes according to the R, G, B, IR monoblock filters. As an example, FIGS. 5, 7, and 8 show the microlens 32 associated with the IR infrared filter thicker than the microlenses 32 associated with the other R, G, and B colored filters.

Each photosite 18 may comprise a photodetector PH, two photodetectors PH, or more than two photodetectors PH. In the embodiment shown in FIGS. 1 and 2, each photosite 18 comprises a single photodetector PH. According to an embodiment, photodetectors PH may have different lateral dimensions. As shown in FIG. 1, each photodetector PH of a photosite 18 covered with an IR infrared filter has greater lateral dimensions than a photodetector PH of a photosite 18 covered with one of the R, G, or B colored filters. According to another embodiment, photodetectors PH may have the same dimensions. In this case, when photosites 18 do not have the same dimensions, it is possible for the number of photodetectors PH per photosite 18 not to be constant. As an example, each photosite 18 covered with an IR infrared filter may comprise more than one photodetector PH while each photosite 18 covered with an R, G, or B colored filter may comprise a single photodetector PH. In particular, each photosite 18 covered with an infrared filter preferably comprises as many photodetectors PH as there are different types of R, G, and B colored filters.

According to another embodiment, photosites 18 and the R, G, B, and IR monoblock filters may have the same lateral dimensions. Microlenses 32 may then have identical structures for all the R, G, B, IR monoblock filters.

Figure 7:
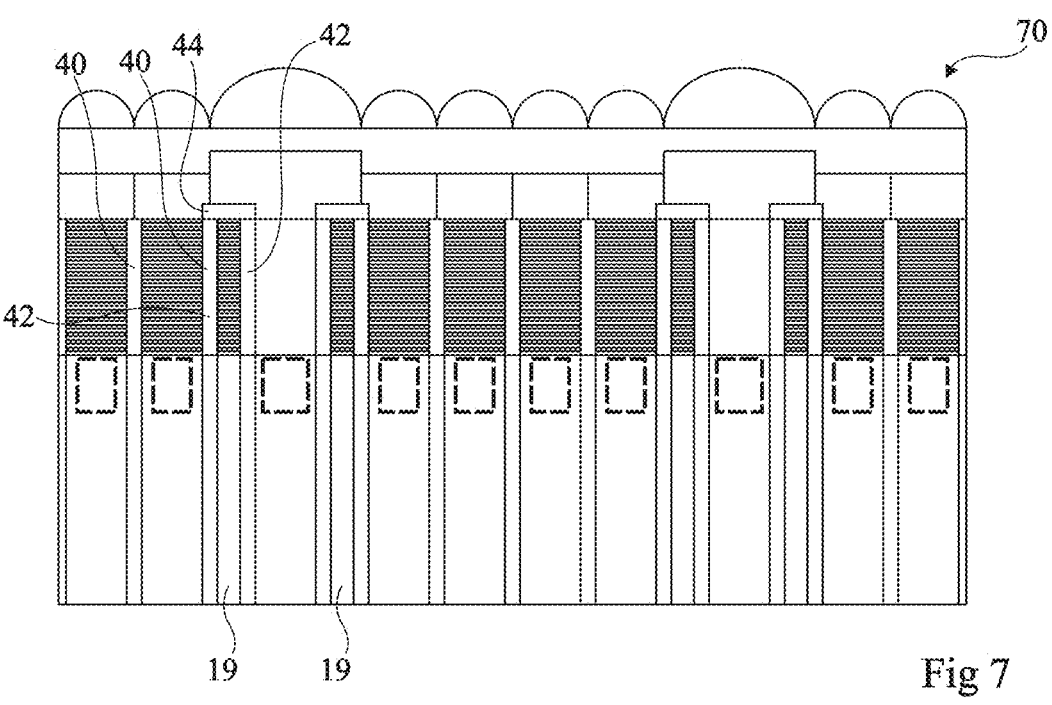
FIG. 7 is a partial simplified cross-section view of another embodiment of an image sensor comprising a pixelated interference filter and an array of microlenses.
Figure 8:
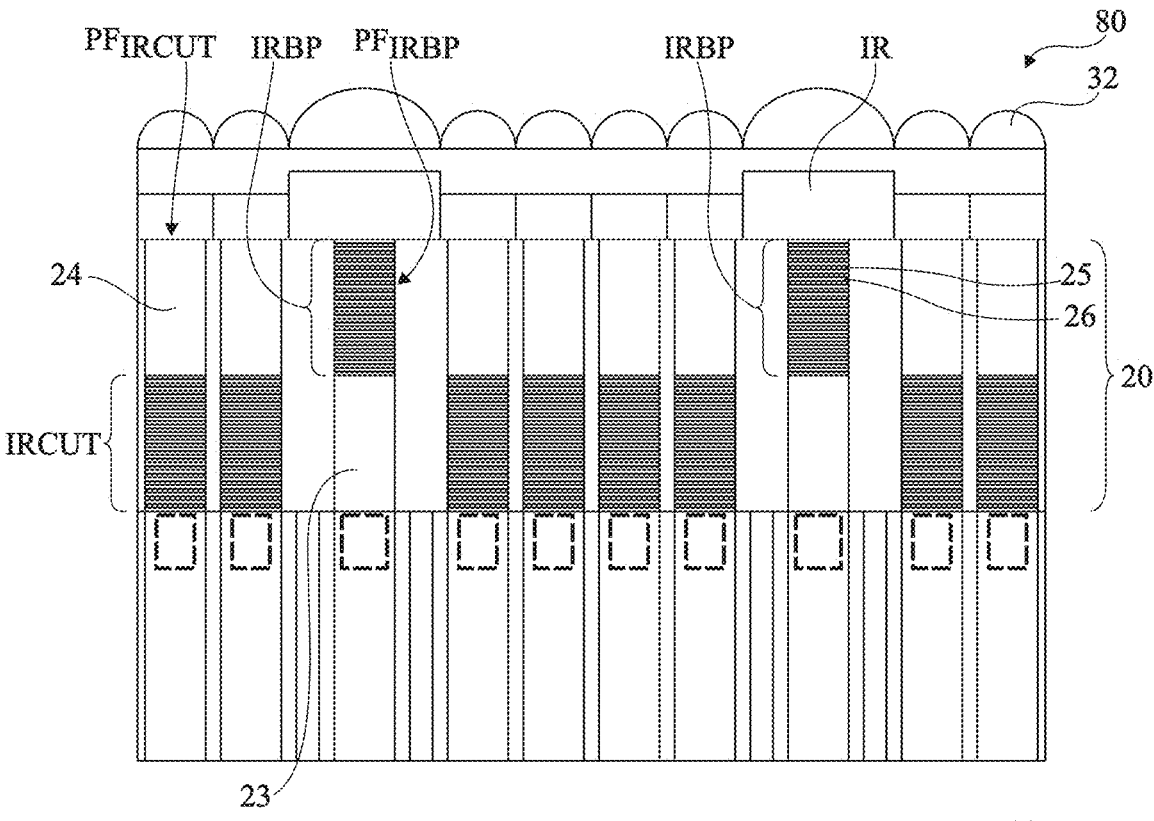
FIG. 8 is a partial simplified cross-section view of another embodiment of an image sensor comprising a pixelated interference filter and an array of microlenses.

FIG. 7 is a partial simplified cross-section view of another embodiment of an optoelectronic device 70 corresponding to an image sensor. Optoelectronic device 70 comprises all the elements of the optoelectronic device 60 shown in FIGS. 5 and 6, with the difference that the walls 40 covering portions 19 comprises two lateral walls 42 and a cover 44 extending between the two lateral walls 40. According to an embodiment, each wall 42 extends across the entire thickness of pixelated filter 20 and cover 44 extends between the ends of each wall 42 opposite to substrate 12. Walls 40 may be formed by the etching of trenches in pixelated filter 20. An advantage of the present embodiment is that all the trenches etched in pixelated filter 20 for the forming of walls 40 have the same lateral dimensions.

FIG. 8 is a partial simplified cross-section view of another embodiment of an optoelectronic device 80 corresponding to an image sensor. Optoelectronic device 80 comprises all the elements of the optoelectronic device 60 shown in FIGS. 5 and 6, with the difference that each first filter pixel $PF_{IRCUT}$ further comprises a dielectric block 24 which covers interference filter IRCUT and that each second filter pixel $PF_{IRBP}$ further comprises an interference filter IRBP covering dielectric block 23.

Each interference filter IRBP comprises an alternation of layers 25 of a third dielectric material having a high refraction index $n_{H2}$ and of layers 26 of a fourth dielectric material having a low refraction index $n_{B2}$, smaller than high refraction index $n_{H2}$, where layers 25 may have different thicknesses and layers 26 may have different thicknesses. Preferably, all interference filters IRBP have the same structure. Refraction index $n_{H2}$ may be in the range from 1.8 to 4.5. Refraction index $n_{B2}$ may be in the range from 1.3 to 2.5.

The third dielectric material may be selected from the group comprising amorphous silicon (aSi), hydrogenated amorphous silicon (aSiH), and mixtures of these compounds. According to an embodiment, the second and fourth materials are identical.

According to an embodiment, the second filter pixels $PF_{IRBP}$ may essentially transmit an infrared radiation in a single wavelength range having a width in the range from 10 nm to 100 nm.

According to an embodiment, the IR filter covering each second filter pixel $PF_{IRBP}$ is made of black resin. The filter advantageously enables to block radiations at wavelengths smaller than approximately 800 nm and eases the design of interference filter IRBP. However, according to another embodiment, the IR filter may be replaced with resin at least partially transparent to visible light.

The thickness of each dielectric block 24 may be equal to the thickness of interference filter IRBP. According to another embodiment, each second filter pixel $PF_{IRBP}$ further comprises a dielectric layer, not shown, covering interference filter IRBP. In this case, each dielectric block 24 may then have substantially the same thickness, measured along the stacking direction, as the sum of the thickness of interference filter IRBP and of the thickness of this dielectric layer.

Advantageously, in the case where the focal image plane of each microlens 32 is located on the surface of pixelated filter 20 in contact with the R, G, B, IR monolithic filters, the dimensions of microlenses 32 do not depend on the thickness, measured along the stacking direction of the pixelated filter 20. Thereby, even if the thickness of the pixelated filter 20 of the optoelectronic device 50 shown in FIG. 3 may be greater than the thickness of the pixelated filter 20 of the optoelectronic device 10 shown in FIGS. 1 and 2, the dimensions of microlenses 32, particularly, the focal length of the microlenses 32 of optoelectronic device 80, may be identical to the dimensions of the microlenses 32 of optoelectronic device 60.

FIGS. 9A to 9D are partial simplified cross-section views of structures obtained at successive steps of an embodiment of a method of manufacturing the image sensor shown in FIG. 1.

Figure 9A:
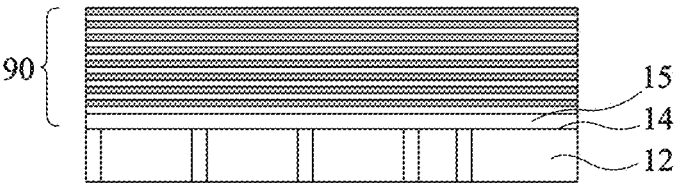
FIG. 9A is a partial simplified cross-section view of the structure obtained at a step of an embodiment of a method of manufacturing the image sensor shown in FIG. 1.

FIG. 9A shows the structure obtained after the deposition of dielectric layer 15 and the deposition of a stack 90 of dielectric layers having the desired structure of the first interference filters $PF_{IRCUT}$ over the entire surface 14 of substrate 12.

Figure 9B:
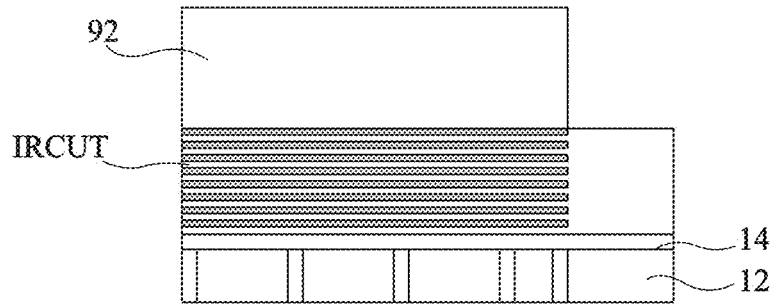
FIG. 9B illustrates another step of the method.

FIG. 9B shows the structure obtained after the etching of stack 90 at the level of the desired locations of the second filter pixels $PF_{IRBP}$ to only keep filters IRCUT at the locations of the first filter pixels $PF_{IRCUT}$ and the deposition of a dielectric layer 92, made of the material forming blocks 23, on interference filters IRCUT and on substrate 12 between interference filters IRCUT. The thickness of dielectric layer 92 is greater than or equal to the thickness of interference filters IRCUT.

Figure 9C:
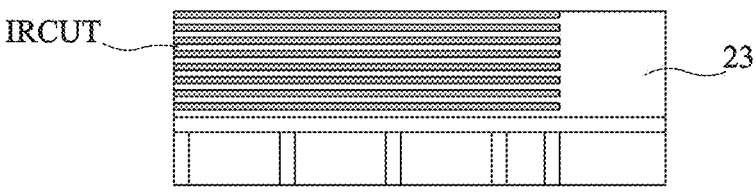
FIG. 9C illustrates another step of the method.

FIG. 9C shows the structure obtained after a step of planarization, for example, a chemical-mechanical polishing (CMP), which results in the removal of dielectric layer 92 from the first interference filters IRCUT to only keep the blocks 23 of the second filter pixels $PF_{IRBP}$. In the present embodiment, the last layer at the top of interference filters IRCUT may play the role of a stop layer for the planarization step.

Figure 9D:
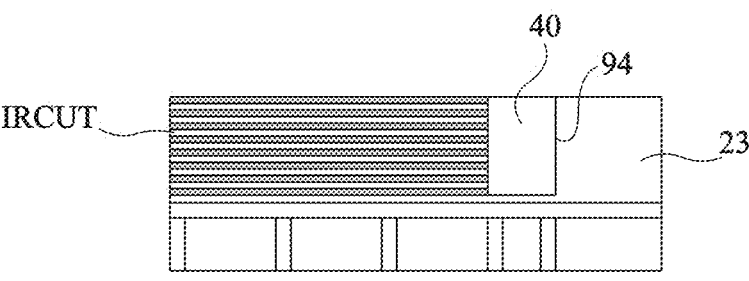
FIG. 9D illustrates another step of the method.

FIG. 9D shows the structure obtained after the forming of walls 40. This may comprise the etching of trenches 94 in stack 90 at the level of the desired locations of walls 40 and the filling of the trenches with the material or the materials forming walls 40.

Advantageously, walls 40 are formed after the forming of stack 90. Thereby, stack 90 may be formed on a substantially planar surface 14. If a shield of protection of portions 19 was formed on surface 14 before the forming of stack 90, the presence of the shield might disturb the forming of stack 90. Indeed, since the stack layers are conformally deposited, steps would form on the shield, so that the contours of interference filters IRCUT would be poorly defined. Further, it would be difficult to etch stack 90 at the locations of second filter pixels $PF_{IRBP}$, the steps causing false detections of the end of etching of the layers of stack 90.

At the step previously described in relation with FIG. 9B, stack 90 is not etched at the locations of the electronic components so that the forming of walls 40 at the step previously described in relation with FIG. 9D comprises a step of etching of stack 90. As a variant, at the step previously described in relation with FIG. 9B, stack 90 is also etched at the locations of the electronic components so that, at the step previously described in relation with FIG. 9C, blocks 23 also extend on the locations of the electronic components to be protected. The forming of walls 40, at the step previously described in relation with FIG. 9D, then comprises a step of etching of blocks 23. In particular, after the forming of walls 40, a portion of the material forming blocks 23 may be present between blocks 23 and the first filter pixels $PF_{IRCUT}$. As a variant, at the step previously described in relation with FIG. 9B, stack 90 is only etched over a portion of the locations of the electronic components to be protected, so that, at the step previously described in relation with FIG. 9C, blocks 23 also extend over the remaining portion of the locations of the electronic components to be protected. The forming of walls 40, at the step previously described in relation with FIG. 9D, then comprises a step of etching of trenches 94 in stack 90 and in blocks 23.

Various embodiments and variants have been described. Those skilled in the art will understand that certain features of these embodiments can be combined and other variants will readily occur to those skilled in the art. In particular, although in the previously-described embodiments, walls 40 are formed after the forming of the first and second filter pixels $PF_{IRCUT}$ and $PF_{IRBP}$, walls 40 may be formed after the forming of the first filter pixels $PF_{IRCUT}$ and before the forming of the second filter pixels $PF_{IRBP}$. Finally, the practical implementation of the described embodiments and variations is within the abilities of those skilled in the art based on the functional indications given hereabove.

The invention claimed is:

1. An image sensor comprising:
a substrate comprising first portions containing photodetectors adapted to capturing a radiation and second portions containing electronic components located between some of the first portions;
insulation trenches extending in the substrate and delimiting the first and second portions;
a pixelated filter comprising filter pixels having at least certain components comprising an interference filter comprising a stack of planar layers; and
shields reflecting or absorbing said radiation covering completely the second portions and comprising walls reflecting or absorbing said radiation extending between filter pixels over at least a portion of the height of the pixelated filter.

2. The image sensor according to claim 1, wherein the pixelated filter comprises first and second opposite surfaces, wherein the walls extend from the first surface to the second surface and delimit the filter pixels.

3. The image sensor according to claim 2, comprising an array of lenses resting on the second surface, the pixelated filter being interposed between a substrate and the array of lenses, the first surface being on the substrate side and the second surface being on a lens side, a focal plane of the lenses corresponding to the second surface to within 500 nm.

4. The image sensor according to claim 1, wherein the walls are at least partly metallic.

5. The image sensor according to claim 1, wherein the filter pixels are distributed into first filter pixels and second filter pixels, each first filter pixel comprising a first interference filter.

6. The image sensor according to claim 5, comprising colored filters interposed between the first filter pixels and the lenses, the colored filters comprising at least first colored filters adapted to giving way to visible light only in a first wavelength range and second colored filters adapted to giving way to visible light only in a second range of wavelengths different from the first range.

7. The image sensor according to claim 5, wherein each first filter pixel comprises a first dielectric block covering the first interference filter.

8. The image sensor according to claim 5, wherein each second filter pixel comprises a second dielectric block having a thickness greater than or equal to the thickness of the first interference filter.

9. The image sensor according to claim 8, wherein each first filter pixel comprises a first dielectric block covering the first interference filter, wherein each second filter pixel comprises a second interference filter covering the second dielectric block, wherein, for at least one of the second filter pixels, the second dielectric block of the second filter pixel is interposed between the first interference filters of two first filter pixels and the second interference filter of the second filter pixel is interposed between the first dielectric blocks of the two first filter pixels.

10. The image sensor according to claim 5, wherein each first interference filter comprises an alternation of first dielectric layers of a first dielectric material having a first refraction index in the visible range and of second dielectric layers of a second dielectric material having a second refraction index in the visible range smaller than the first refraction index.

11. The image sensor according to claim 9, wherein each second interference filter comprises an alternation of third dielectric layers of a third dielectric material having a third refraction index in the infrared range and of fourth dielectric layers of a fourth dielectric material having a fourth refraction index in the infrared range smaller than the third refraction index.

12. The image sensor according to claim 1, wherein the planar layers of the interference filters come into contact with the walls.

13. A method of manufacturing an image sensor according to claim 1, comprising the steps of:

a) deposition, on the substrate, of a stack of dielectric layers having the structure of the interference filters; and b) forming of the walls in the stack.

14. The method according to claim 13, wherein the filter pixels are distributed into first filter pixels and second filter pixels, the method comprising the steps of:

c) etching of the stack to remove the stack from the locations of the second filter pixels and keep the interference filters at the locations of the first filter pixels;

d) deposition of an insulating layer, having a thickness greater than the thickness of the stack, on the interference filters and between the interference filters; and e) etching of at least a portion of the insulating layer on the interference filters.

* * * * *